US010424465B2

(12) United States Patent
Zong

(10) Patent No.: US 10,424,465 B2
(45) Date of Patent: Sep. 24, 2019

(54) PLASMA POLYMERIZATION COATING APPARATUS

(71) Applicant: Jiangsu Favored Nanotechnology Co., LTD, Wuxi, Jiangsu Province (CN)

(72) Inventor: Jian Zong, Wuxi (CN)

(73) Assignee: Jiangsu Favored Nanotechnology Co., LTD, Wuxi (CN)

( * ) Notice: Subject to any disclaimer, the term of this patent is extended or adjusted under 35 U.S.C. 154(b) by 120 days.

(21) Appl. No.: 15/890,476

(22) Filed: Feb. 7, 2018

(65) Prior Publication Data

US 2018/0174803 A1 Jun. 21, 2018

Related U.S. Application Data

(63) Continuation-in-part of application No. PCT/CN2017/081773, filed on Apr. 25, 2017.

(30) Foreign Application Priority Data

Nov. 30, 2016 (CN) .......................... 2016 1 1076904

(51) Int. Cl.
*H01J 37/32* (2006.01)
*C23C 16/458* (2006.01)
(Continued)

(52) U.S. Cl.
CPC ...... *H01J 37/32449* (2013.01); *C23C 16/455* (2013.01); *C23C 16/458* (2013.01);
(Continued)

(58) Field of Classification Search
CPC .............................................. C23C 16/45559
(Continued)

(56) References Cited

U.S. PATENT DOCUMENTS 4,632,842 A * 12/1986 Karwoski ................. A61F 2/06
427/2.25
4,828,369 A * 5/1989 Hotomi ..................... G02F 1/15
118/723 IR
(Continued)

FOREIGN PATENT DOCUMENTS

CN         87106283 A        3/1988
CN        102024658 A  *     4/2011
(Continued)

OTHER PUBLICATIONS

CN102024658 Wei (2011) English Machine Translation retrieved from Espacenet Apr. 23, 2018 (Year: 2011).*

*Primary Examiner* — Rakesh K Dhingra
*Assistant Examiner* — Laureen Chan
(74) *Attorney, Agent, or Firm* — Perkins Coie LLP

(57) ABSTRACT

Introduced here is a plasma polymerization apparatus. Example embodiments include a reaction chamber in a shape substantially symmetrical to a central axis. Some examples further include a rotation rack in the reaction chamber. The rotation rack may be operable to rotate relative to the reaction chamber about the central axis of the reaction chamber. Examples may further include two reactive species discharge mechanisms positioned around a perimeter of the reaction chamber and configured to disperse reactive species into the reaction chamber in a substantially symmetrical manner from the outer perimeter of the reaction chamber toward the central axis of the reaction chamber, such that the reactive species form a polymeric coating on surfaces of the one or more substrates during said dispersion of the reactive species, and a collecting tube positioned along the central axis of the reaction chamber and having an air pressure lower than the reaction chamber.

19 Claims, 2 Drawing Sheets

(51) Int. Cl.
*C23C 16/50* (2006.01)
*C23C 16/455* (2006.01)

(52) U.S. Cl.
CPC .... *C23C 16/4588* (2013.01); *C23C 16/45508* (2013.01); *C23C 16/50* (2013.01); *H01J 37/32357* (2013.01); *H01J 37/32541* (2013.01); *H01J 37/32596* (2013.01); *H01J 37/32733* (2013.01); *H01J 37/32779* (2013.01); *H01J 37/32862* (2013.01); *H01J 2237/20214* (2013.01); *H01J 2237/3323* (2013.01)

(58) Field of Classification Search
USPC .................................... 118/723 MP, 723 ER
See application file for complete search history.

(56) References Cited

U.S. PATENT DOCUMENTS

| | | | | |
|---|---|---|---|---|
| 4,926,793 A | * | 5/1990 | Arima | C23C 8/36 118/715 |
| 4,996,077 A | * | 2/1991 | Moslehi | C23C 16/452 118/719 |
| 5,279,669 A | * | 1/1994 | Lee | B01J 19/126 118/723 I |
| 5,286,297 A | * | 2/1994 | Moslehi | C23C 16/4405 118/723 E |
| 5,591,268 A | * | 1/1997 | Usui | C23C 16/4412 118/719 |
| 5,653,811 A | * | 8/1997 | Chan | H01J 37/20 118/723 I |
| 8,961,694 B2 | * | 2/2015 | Wieringa | H01J 37/32357 134/1.1 |
| 2005/0211171 A1 | * | 9/2005 | Hanawa | C23C 16/045 118/723 R |
| 2006/0185592 A1 | * | 8/2006 | Matsuura | H01L 21/31116 118/715 |
| 2008/0173238 A1 | * | 7/2008 | Nakashima | C23C 16/345 118/723 R |
| 2012/0100722 A1 | * | 4/2012 | Asai | C23C 16/08 438/758 |
| 2012/0272892 A1 | * | 11/2012 | Paranjpe | C30B 25/10 117/86 |
| 2013/0168352 A1 | * | 7/2013 | Fischer | H01J 37/32357 216/67 |

FOREIGN PATENT DOCUMENTS

| | | |
|---|---|---|
| CN | 204497191 U | 7/2015 |
| CN | 105949836 A | 9/2016 |
| CN | 206304929 U | 7/2017 |
| JP | S5938375 A | 3/1984 |
| JP | S59211220 A | 11/1984 |
| JP | S6043488 A | 3/1985 |
| JP | H01205078 A | 8/1989 |
| JP | 2007297661 A | 11/2007 |

* cited by examiner

PLASMA POLYMERIZATION COATING APPARATUS

CROSS-REFERENCE TO RELATED APPLICATIONS

This application is a continuation-in-part (CIP) of Patent Cooperation Treaty (PCT) Patent Application No. PCT/CN2017/081773, filed Apr. 25, 2017, which claims priority to Chinese Invention Patent Application No. 201611076904.8, filed Nov. 30, 2016, all of which are incorporated herein by reference in their entirety.

TECHNICAL FIELD

The present disclosure relates to plasma polymerization technologies and, more specifically, to a plasma polymerization coating apparatus.

TECHNICAL BACKGROUND

The plasma polymerization coating treatment is an important surface treatment technique because of its advantages over other conventional techniques. For example, in plasma polymerization coating, polymers can be directly attached to a desired surface where the chains are growing, which reduces the overall number of steps necessary for the coating. Other advantages include a wider selection of monomers, as compared to conventional chemical polymerization techniques. To perform plasma polymerization coating, a substrate to be treated can be first placed in a vacuum chamber, and then a carrier gas and a gaseous organic monomer are dispersed into the vacuum chamber. The gaseous organic monomer is turned into a plasma state by discharging electrical power to the monomer to produce various types of reactive species. Next, addition reactions between the reactive species and the monomer, or between the reactive species themselves, take place and form a polymer film on the substrate's surface. In certain applications such as hydrophobic or oleophobic film coating, nanoscale plasma polymerization coating is capable of producing results with highly desirable characteristics.

However, due to various shortcomings in existing designs of conventional plasma nanocoating equipment, conventional plasma polymerization processing often suffers from production limitations, resulting in small batch size, low efficiency, high cost, and poor batch uniformity.

BRIEF DESCRIPTION OF DRAWINGS

One or more embodiments of the present disclosure are illustrated by way of example and not limitation in the figures of the accompanying drawings, in which like references indicate similar elements. These drawings are not necessarily drawn to scale.

DETAILED DESCRIPTION

Figure 1:
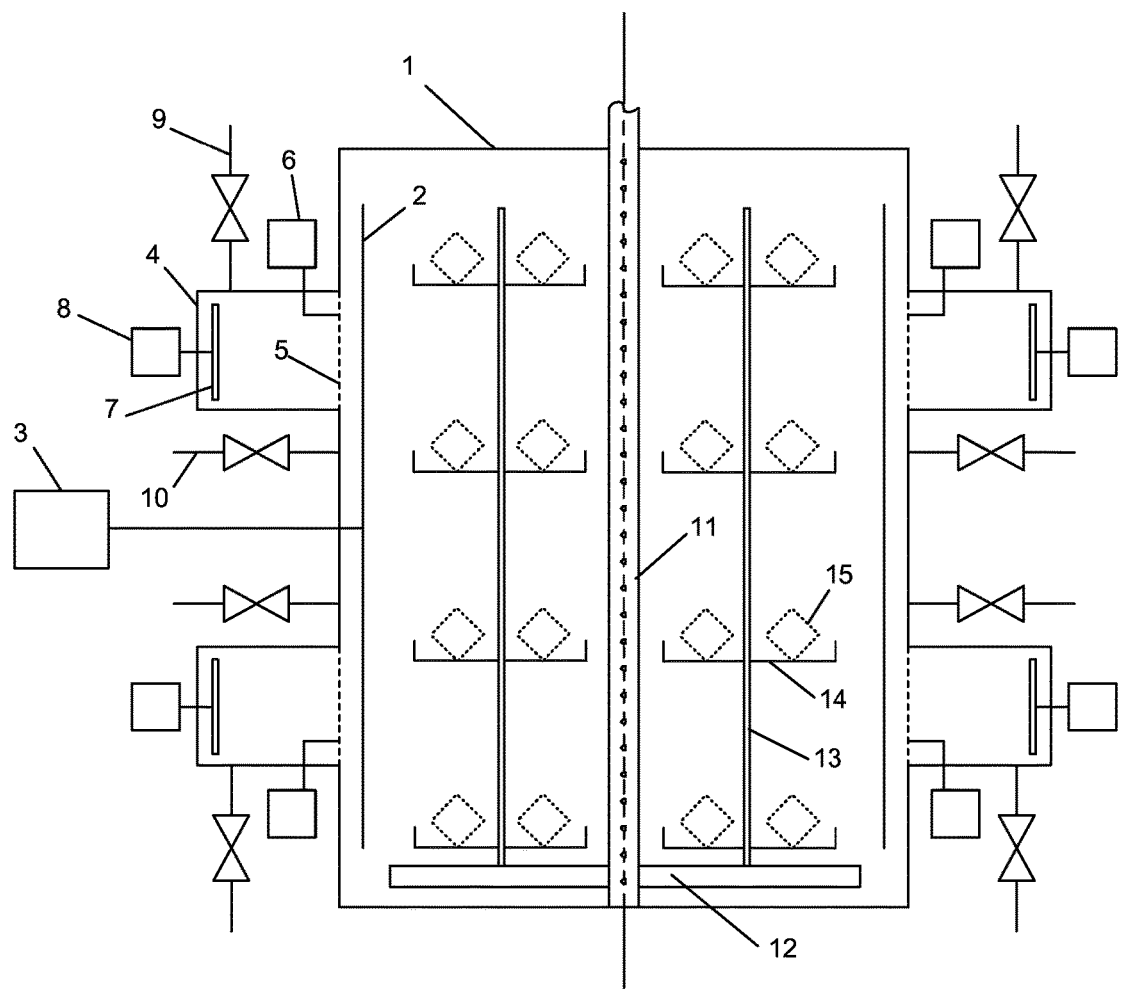
FIG. 1 is a schematic front sectional view of the structure of an example plasma polymerization coating device with planetary rotation axles arranged on the rotation rack, according to one or more embodiments of the present disclosure.

Certain specific embodiments of the present disclosure will be described in detail below in reference to the related technical solutions and accompanying drawings. In the following description, numerous specific details are set forth to provide a thorough understanding of the presently disclosed technology. In other embodiments, the techniques described here can be practiced without these specific details. In other instances, well-known features, such as specific fabrication techniques, are not described in detail in order to avoid unnecessarily obscuring the present technology. References in this description to "an embodiment," "one embodiment," or the like mean that a particular feature, structure, material, or characteristic being described is included in at least one embodiment of the present disclosure. Thus, the instances of such phrases in this specification do not necessarily all refer to the same embodiment. On the other hand, such references are not necessarily mutually exclusive either. Furthermore, the particular features, structures, materials, or characteristics can be combined in any suitable manner in one or more embodiments. Also, it is to be understood that the various embodiments shown in the figures are merely illustrative representations and are not necessarily drawn to scale.

As previously mentioned, nanoscale plasma polymerization coating is capable of producing results with highly desirable characteristics and can perform well in certain applications, such as hydrophobic film coating. However, since the nanopolymer coating tends to be very thin, it can be difficult to achieve the required uniformity of the coating.

Conventional plasma nanocoating devices are typically equipped with a rectangular vacuum chamber, and as a result, during the coating process, the positions of the substrate-carrying platforms and the substrate placed thereon are typically fixed in such a conventional vacuum chamber. Because different substrates in the same batch are in different positions in the vacuum chamber, they are at varying distances from the electrodes, monomer/carrier gas outlet, vacuum gas outlet, etc. Accordingly, it is inevitable that the coating uniformity of substrates that are in the same batch but are in different locations of the chamber is low. Hence, in order to reduce the variation in uniformity within the same batch treatment, currently available plasma nanocoating devices typically adopt a vacuum chamber with a small volume and treat in small-quantity batches. This method greatly reduces processing efficiency and increases the cost. Even so, it may still not produce a satisfactory batch uniformity that meets a client's requirement. With the rapid expansion of nanopolymer coating applications, demands for such processing are increasing rapidly. Consequently, it is urgent to solve the technical problems faced by the existing plasma nanocoating processing techniques, such as small batch size, low efficiency, high cost, poor batch uniformity, and so forth.

The techniques disclosed here solve the technical problem with a new type of plasma nanocoating device. Various aspects of the design solve the aforesaid technical problems of the existing plasma nanocoating processes, such as small batch size, low efficiency, high cost, and poor batch uniformity.

One example of the present disclosed embodiments is a plasma polymerization coating device that includes a vacuum chamber. The vacuum chamber has a chamber body inner wall along a perimeter of the vacuum chamber. The chamber body inner wall may be characterized by a top view cross section of it being a circle with the same diameter as other top view cross sections, or a polygon with the same edge length as other top view cross sections. Some embodiments of said polygon have at least six edges.

For purposes of the present disclosure, the term "vacuum chamber" means a chamber having a vacuum pump attached to exhaust gas; the term does not necessarily mean that the chamber is exhausted to a vacuum state. In some examples, during the coating process, the vacuum chamber can be first exhausted of air to a base pressure around 5 mTorr and then filled with the carrier gas. After carrier gas filling, the air pressure in the vacuum chamber may rise a little, to around tens of mTorr.

In some embodiments, porous electrodes are installed in the vacuum chamber close or proximal to the inner wall of the vacuum chamber. The porous electrodes may form a porous arched structure with a distance from the inner wall of the vacuum chamber. In some embodiments, the porous electrodes can be connected with a high frequency (e.g., radio frequency) power source. Depending on the implementation, the power of the radio frequency power source can be from 15 to 1,000 Watts (W). Note that, in some embodiments, the plasma generated during power discharge can be used for substrate surface cleaning and pretreatment. According to some embodiments, the gas that is used for produce plasma for cleaning (e.g., pretreating the surface of the substrate) purposes contain oxygen.

In one or more embodiments, high frequency power source is used for the benefit of being capable of driving the discharge even when and if the electrodes are covered by dielectric coatings; as a comparison, direct current (DC) power sources or low frequency power sources (e.g., under 50 Hz) do not have this advantage. The applicable high frequency may range from tens of kilohertz to several gigahertz. Typical high frequencies include 40 KHz, 13.56 MHz and 2.45 GHz, etc. The choice of the frequency may depend on the technical requirement or specification, the existing products' material characteristics, and the cost. It is noted that a person having ordinary skill in the art of dielectric coating should be able to select a suitably high frequency to perform the coating of a specific material.

Additionally, because the high frequency power source is alternating in polarity, instead of the cathode and anode electrodes, the electrodes are grouped as the driving electrodes and the grounding electrodes. In one or more embodiments of the disclosed apparatus, the porous electrode, which connects to the output of the high frequency power source, is the driving electrode. In at least some of these embodiments, the vacuum chamber wall can act as the grounding electrode. Additionally or alternatively, the tail gas collecting tube can also act as the grounding electrode.

In some embodiments, at least two discharge cavities are provided on an outer wall of the vacuum chamber in a sealed manner. In some examples, the porous electrodes and the discharge cavities are able to discharge together or separately according to the needs of the specific processes.

Specifically, depending on the embodiment, the porous electrodes and the discharge cavities are independent to each other, and they can be operated either together or separately. In some embodiments, during the polymeric coating process, the porous electrodes are used for (1) pre-treatment of the samples and (2) post-cleaning of the chamber. That is to say, in these embodiments, the porous electrodes do not work during coating process. On the other hand, according to one or more embodiments, the discharge cavities are mainly used for coating. Additionally or alternatively, the discharge cavities can also be used for post-cleaning of the cavities themselves.

The porous electrodes generate plasma for cleaning, that is, the surface cleaning: porous electrodes continuously discharge with relatively high power to produce a strong plasma, which will be used for cleaning organic impurities on the substrate surface, such as water and oil stains, as well as activate organic substrate to form dangling bonds to facilitate coating deposition and enhance the binding force between the substrate and the coating; moreover, the porous electrodes do not work during the coating process.

The discharge cavities produce the plasma for polymerization. During the coating process, the discharge cavities discharge at a relatively low power to generate weak plasma, which is controlled by the metal grid be to be intermittently released and enter the vacuum chamber to initiate monomer polymerization and deposition on the surface of the substrate to form a coating.

For purposes of the disclosure here, the term "strong plasma with relatively high power" is defined relative to the plasma and discharge power of the cavities. The typical discharge power for "strong plasma with relatively high power" can be several hundred Watts, and the plasma density is at $10^9$-$10^{10}$/cm$^3$ order. The term "weak plasma with relatively low power" is defined relative to the plasma and discharge power of the electrodes. Typical discharge power for "weak plasma with relatively low power" can be several Watts to tens of Watts, and the plasma density is at $10^7$-$10^8$/cm$^3$ order.

Example materials for the monomer contain acrylate, such as ethoxylated trimethylolpropane triacrylate, or (perfluorocyclohexyl) methyl acrylate.

In some embodiments, at least two layers of metal grid are provided at the connecting positions of the discharge cavities and the inner walls of the vacuum chamber. The metal grid is insulated from the inner wall of the vacuum chamber. In one or more embodiments, the metal grid is connected to a pulse power source. The pulse power source can apply a positive electrical pulse bias on the metal grid, and in some examples, the plasma generated in the discharge cavity is intermittently released into the vacuum chamber. For example, the plasma can be (at least partially) blocked by the multilayer metal grid within the discharge cavity during a period of pulse-off, and the plasma can pass through the multilayer metal grid during a period of pulse-on into the vacuum chamber. The plasma can trigger the monomer vapor to have a polymerization reaction in the vacuum chamber.

Inside the discharge cavity can include a discharge source. One end of the discharge source can be connected to a power source and with a carrier gas pipe. The other end of the carrier gas pipe is connected to a carrier gas source. A monomer vapor pipe can be connected to the vacuum chamber, and an outlet thereof can be located in front of the discharge cavity. The other end of the monomer vapor pipe can be connected to a monomer vapor source.

According to some embodiments, a tail gas collecting tube can be vertically provided along the central axis of the vacuum chamber, with one end of the tail gas collecting tube extending from the vacuum chamber and connected to a vacuum pump. Holes can be provided on the wall of the tail gas collecting tube.

In some embodiments, a rotation rack for carrying a substrate to be treated is provided in the vacuum chamber. A rotation shaft can be coaxial with the central axis of the vacuum chamber. A substrate to be treated can be placed on the rotatable rack.

The top cover and the bottom cover of the vacuum chamber may be in a flat plate or an arched structure, such as a spherical segment, a regular polygon, or an oval. In some embodiments, the structure matches the top view cross section of the chamber body inner wall of the vacuum chamber.

In some embodiments, the porous electrodes may be in a cylindrical shape or at least divided into two sections of cylindrical shape, and the porous electrodes can be coaxial with the vacuum chamber. In some embodiments, the porous electrodes' distance from the inner wall of the vacuum chamber can range from 1 to 6 cm. The porous electrodes can be covered by through holes, and the size of a through hole can range from 2 to 30 mm. The space between through holes can range from 2 to 30 mm.

The discharge cavity can be in a cylindrical shape, and can be made from materials including, for example, aluminum, carbon steel, or stainless steel material. The diameter of the discharge cavity can range from 5 to 20 cm, the depth from 3 to 15 cm, and the distance between two neighboring discharge cavities from 7 to 40 cm.

The number of layers of the metal grid can range from 2 to 6. The metal grid can be made of materials including, for example, stainless steel or nickel. The hole size of the metal grid ranges from 100 to 1,000 meshes, and the transmissivity can range from 25% to 40%.

In some embodiments, the pulse power source outputs a positive pulse with the following parameters: peak is from 20 to 140 V, pulse width is from 2 µs to 1 ms, and repeat frequency is from 20 Hz to 10 KHz.

Depending on the embodiment, the discharge source can be a lamp filament, an electrode, an induction coil, or a microwave antenna. The discharge source can have discharge power ranging from 2 to 500 W.

The distance between the outlet of the monomer vapor pipe and the discharge cavity can range from 1 to 10 cm.

The inner diameter of the tail gas collecting tube can range from 25 to 100 mm. In some embodiments, holes can be evenly provided on the wall of the tail gas collecting tube. The hole size can range from 2 to 30 mm, and the space between holes can range from 2 to 100 mm.

The rotation shaft of the rotation rack can be coaxial with the central axis of the vacuum chamber. In some embodiments, the rotation rack is adapted to rotate about the rotation shaft thereof. Depending on the variation, 2 to 8 substrate platforms can be symmetrically fixed on the rotation rack, and the material to be treated can be placed on the substrate platforms.

The rotation shaft of the rotation rack can be coaxial with the central axis of the vacuum chamber. In some embodiments, the rotation rack is adapted to rotate about the rotation shaft thereof. Depending on the variation, 2 to 8 planetary rotation shafts are symmetrically provided on the rotation rack. The planetary rotation shafts may be perpendicular to the rotation rack and, in some embodiments, may be able to rotate.

The planetary rotation shafts can be provided with 2 to 8 layers of rotation substrate platforms. The material to be treated can be placed on the substrate platforms.

Note that, even though there is no particular directional requirement for the rotation of the planetary rotation shaft versus the rotation of the rotation rack, overall the rotations should be suitably tuned and adjusted (e.g., for the sake of rotational balance and stability) such that substantially all samples can experience the same spatial movement during the coating process in order to achieve uniform coating. Similarly, there is no particular limitation on the rotational speed; however, it is apparent that an overly fast rotational speed is unfavorable because of the unnecessary power consumption, part wear, as well as instability of the platform.

Overall, the present disclosure has the following beneficial effects:

1. The device employs a central axis symmetrical vacuum chamber structure to maintain the stability of space polymerization reaction active material density.

The vacuum chamber adopts a mechanism in which the gas is fed via the side wall, transported radially, and discharged along the direction of central axis.

In one or more embodiments, the carrier gas pipe is provided in each discharge cavity and with an outlet. A carrier gas can enter the discharge cavities via a pipe of carrier gas, and then diffuse into the vacuum chamber via the multilayer metal grid. The monomer vapor pipe is provided with an outlet in front of discharge cavity in the vacuum chamber. A monomer vapor gas enters the vacuum chamber via a pipe of monomer vapor. In addition, a tail gas collection tube is coaxially provided the vacuum chamber along the axis of the vacuum chamber. The tail gas collection tube vertically penetrates through the vacuum chamber. One end of the tail gas collection tube is connected to a vacuum pump, and holes are evenly distributed on the wall of the tube. A tail gas enters the tail gas collection tube via the holes on the tail gas collection tube, and then is discharged from the vacuum chamber by the vacuum pump.

In the foregoing approach, in which the gas is fed via the side wall, transported radially, and discharged along the direction of central axis, the gas transport process takes place in a convergent manner, which can facilitate an increased stability of reactive species concentration in the space polymerization reaction, and a more evenly distribution of reactive species. An example, specific process can be as follows: the monomer vapor generates polymerization reaction reactive species under the effect of the plasma in the vicinity of each of the discharge cavities. Driven by the carrier gas, the generated polymerization reaction reactive species are radially transported towards the axis of the vacuum chamber. During the process of the foregoing transport, the amount of the polymerization reaction reactive species gradually decreases due to continuous consumption. On the other hand, during the process of the foregoing transport, the polymerization reaction reactive species also gradually converge, which can compensate for the foregoing decrease in the amount of the polymerization reaction reactive species. In this way, the concentration of the polymerization reaction reactive species can remain stable. The bulk density of the reactive species in the vacuum chamber can remain unchanged, and thus the batch treatment can enjoy good uniformity.

In other words, according to at least some aspects of the disclosed embodiments, the reactive species discharge mechanisms and the collecting tube can be collectively configured in a way such that, along the dispersion or the transport of the reactive species from the discharge mechanism toward the collecting tube, a density decrease in the reactive species due to consumption of the reactive species can be substantially equal to a density increase in the reactive species due to the reactive species converging toward the collecting tube, thereby achieving a substantially uniform density of the reactive species across the vacuum chamber. Specifically, in some implementations, a discharge rate of the discharge mechanism can be adjusted (e.g., via controlling the applied electrical power and/or an amount of gas) together with an exhaust rate of the collecting tube (e.g., via adjusting the power of the vacuum pump) such that a substantially uniform density of the reactive species across the vacuum chamber can be achieved. In many embodiments, the aforesaid collective adjustment of the discharge mechanism and the collecting tube corresponds to the shape of the cross section of the inner side wall of a given vacuum chamber. That is to say, in these embodiments, the combination of the discharge rate of the discharge mechanism and the exhaust rate of the collecting tube is preferably tailored to match the particular shape (e.g., a circle, or a polygon) of the given vacuum chamber so as to achieve the substantially uniform density of the reactive species.

As compared to conventional coating devices and technology, the difference in substrate coating thickness of the same batch treatment in the conventional coating devices can be greater than 30%, while the difference in substrate coating thickness of the same batch treatment in the disclosed devices can be smaller than 10%.

2. The device employs a rotation rack to significantly improve the uniformity of each substrate coating.

In one or more embodiments, the vacuum chamber is provided with a rotation rack, the substrate platforms on the rotation rack are able to rotate or make planetary rotation movement in the vacuum chamber. In particular, the disclosed planetary rotary movement mechanism provides that the substrate platforms each rotate around their own planetary rotation axes while making a coaxial revolutionary movement along the substrate platform and around the central axis of the vacuum chamber. A substrate to be treated can be placed on a substrate platform. The introduced planetary rotary movement allows the spatial position of each substrate treated to change continuously during the process of the treatment, such that all of the spatial positions of different substrates in the process of coating treatment can be substantially the same, thereby eliminating the difference in coating due to different spatial positions of different substrates in the existing technology. In this way, the treatments of different substrate become the same, and accordingly, the introduced techniques may achieve the same coating effects and better uniformity for substrates of different locations in the same batch.

3. The device is able to greatly increase the volume of the vacuum chamber, and significantly improve the treatment efficiency.

Due to the improvements in the structures of vacuum chamber and rotation rack, coating film thickness uniformity can be greatly improved for the treatment in the same batch. In addition, the vacuum chamber volume can be expanded 5 to 6 times. Accordingly, the batch treatment quantity and treatment efficiency have been greatly increased.

4. The multilayer grid can retard both the plasma and the monomer.

The multilayer metal grid can place a hindering effect on the diffusion of the carrier gas from the discharge cavity to the vacuum chamber. Accordingly, the pressure in the discharge cavity can be higher than that in the vacuum chamber. Similarly, the multilayer metal grid can place a hindering effect on the reverse-diffusion of the monomer vapor from the vacuum chamber to the cavity. Moreover, since the pressure in the discharge cavity can be higher than that in the vacuum chamber, the monomer vapor may not easily move from the vacuum chamber to the discharge cavity through reverse-diffusion, thereby preventing the monomer vapor from being excessively decomposed and destructed by the continuously discharged plasma in the discharge cavity.

More specifically, the metal grid can help create a pressure differential, so as to reduce or to prevent the carrier gas from backflowing. In a generally vacuum condition, a pressure gradient may exist along the way from the gas inlet to the exhaust exit, even if no mesh exists. This can be measured by vacuum gauges at different positions of the vacuum chamber. Therefore, the strategic placement of the metal grid, such as introduced here, can increase the pressure difference between the discharge cavity and the main vacuum chamber by hindering the carrier gas flow. Generally speaking, the pressure difference may increase with the number of layers, the mesh number, and transmissivity of the grid.

In conclusion, the device according to the present disclosure can effectively protect the monomer vapor from being decomposed and destructed so as to obtain a polymer coating of very good quality.

Representative Embodiment 1

Figure 2:
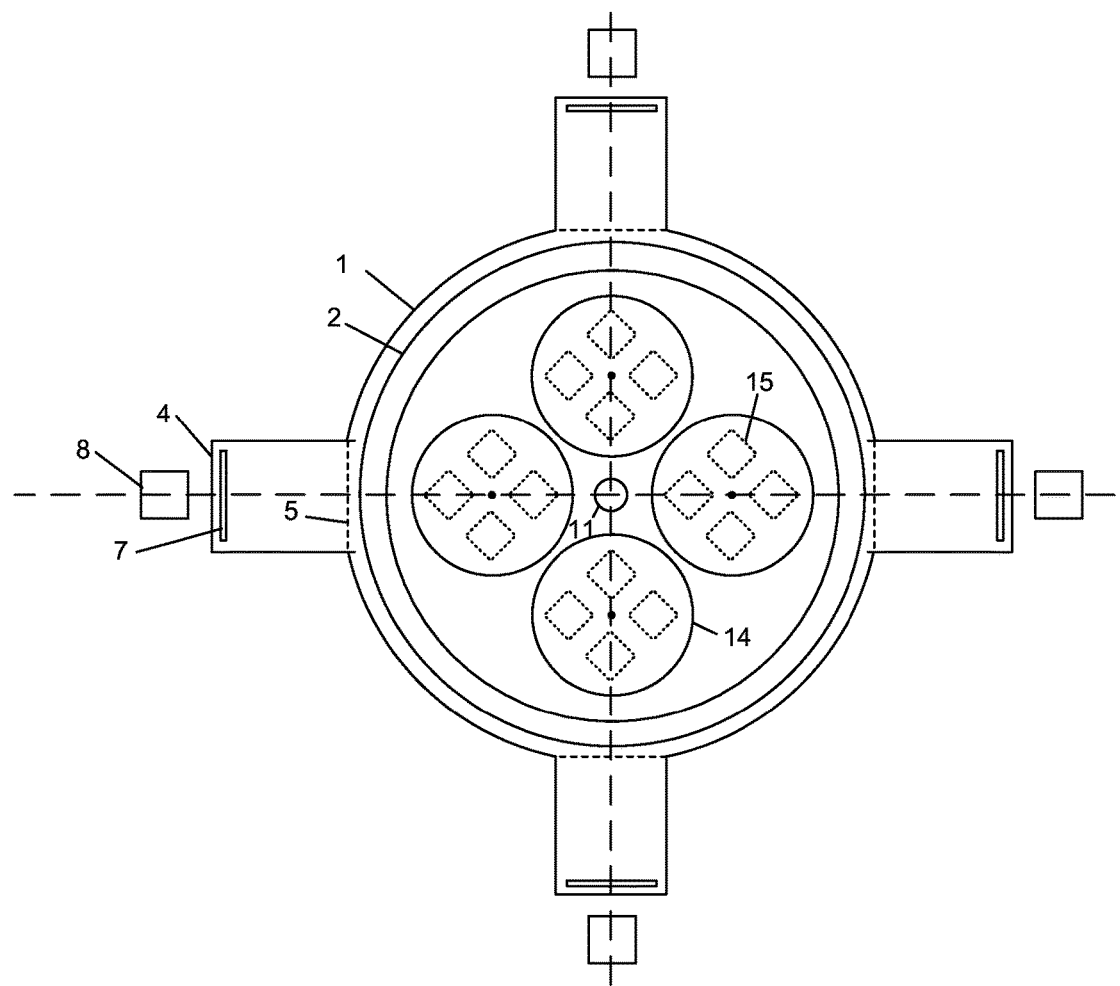
FIG. 2 is a schematic top view of the structure of the example device shown in FIG. 1, according to one or more embodiments of the present disclosure.

As shown in FIGS. 1 and 2, a plasma polymerization coating device includes a vacuum chamber. Any cross section of a chamber body inner wall of the side part of a vacuum chamber 1 is in a circular shape with the same diameter. That is, the chamber body inner wall of the vacuum chamber is in a cylindrical shape.

The top cover and bottom cover of the vacuum chamber 1 are a spherical segment, which matches the cross section of the chamber body inner wall of the side part of the vacuum chamber.

Porous electrodes 2 are installed in the vacuum chamber 1 close to the inner wall of the vacuum chamber 1. The porous electrodes 2 form a porous arched structure and is placed at a distance from the inner wall of the vacuum chamber. The porous electrodes 2 are connected with a radio frequency power source 3. Eight discharge cavities 4 are provided on the outer wall of the vacuum chamber in a sealed manner.

The porous electrodes 2 are in a cylindrical shape and are coaxial with the vacuum chamber. Their distance from the inner wall of the vacuum chamber is 1 cm. The porous electrodes 2 are covered by through holes, with the size of a through hole being 30 mm and the space between through holes being 30 mm. The power of the radio frequency power source connected with the porous electrodes is 15 W.

The discharge cavity 4 is in a cylindrical shape and is made from an aluminum material; the diameter thereof is 5 cm, and the depth thereof is 15 cm. The distance between two neighboring discharge cavities 4 is 40 cm. In addition, the distance between the outlet of the monomer vapor pipe 10 and the discharge cavity 4 is 1 cm.

Two layers of a metal grid 5 are arranged at the connecting positions of the discharge cavities and the inner walls of the vacuum chamber. The metal grid is insulated from the inner wall of the vacuum chamber and is connected to a pulse power source 6. The discharge cavity 4 is provided with a discharge source 7 therein, and the discharge source is connected to a power source 8. The discharge cavity is connected with a carrier gas pipe 9. The other end of the carrier gas pipe is connected to a carrier gas source. A monomer vapor pipe 10 is connected to the vacuum chamber, and an outlet thereof is located in front of the discharge cavity 4, with the other end of the monomer vapor pipe being connected to a monomer vapor source.

The metal grid is made of a stainless steel material, the hole size of the metal grid is 100 meshes, and the rate of pass-through is 40%.

The pulse power source 6 outputs a positive pulse with the following parameters: peak is 20 V, pulse width is 1 ms, and repeat frequency is 10 kHz.

The discharge source 7 is a lamp filament and has a discharge power of 2 W.

A tail gas collecting tube 11 is vertically provided along the central axis of the vacuum chamber. One end of the tail gas collecting tube extends from the vacuum chamber and is connected to a vacuum pump, and holes are provided on the wall of the tail gas collecting tube. The inner diameter of the tail gas collecting tube 11 is 25 mm. Holes are evenly provided on the wall of the tail gas collecting tube; the hole size is 2 mm, and the space between holes is 2 mm.

A rotation rack 12 is provided in the vacuum chamber. The rotation shaft of the rotation rack 12 is coaxial with the central axis of the vacuum chamber, and a substrate to be treated is placed on the rotation rack. Four planetary rotation shafts 13 are symmetrically provided on the rotation rack; the planetary rotation shafts are perpendicular to the rotation rack 12 and are able to rotate.

The planetary rotation shafts are provided with four layers of rotation substrate platforms 14, and the substrates 15 to be treated are placed on the substrate platforms.

Representative Embodiment 2

A plasma polymerization coating device includes a vacuum chamber. Any cross section of a chamber body inner wall of the side part of a vacuum chamber 1 is in the shape of a normal hexagon with the same edge length.

The top cover and bottom cover of the vacuum chamber 1 each have an arched structure in the shape of a normal hexagon, which matches the cross section of the chamber body inner wall of the side part of the vacuum chamber.

Porous electrodes 2 are installed in the vacuum chamber 1 close to the inner wall of the vacuum chamber 1. The porous electrodes 2 form a porous arched structure and is placed at a distance from the inner wall of the vacuum chamber and are connected with a radio frequency power source 3. Two discharge cavities 4 are provided on the outer wall of the vacuum chamber in a sealed manner.

The porous electrodes 2 have two sections of cylindrical shape and are coaxial with the vacuum chamber; their distance from the inner wall of the vacuum chamber is 3 cm. The porous electrodes 2 are covered by through holes, with the size of a through hole being 18 mm and the space between through holes being 15 mm. The power of the radio frequency power source connected with the porous electrodes is 500 W.

The discharge cavity 4 is in a cylindrical shape and is made from a carbon steel material; the diameter thereof is 20 cm, and the depth thereof is 8 cm. The distance between two neighboring discharge cavities 4 is 20 cm. In addition, the distance between the outlet of the monomer vapor pipe 10 and the discharge cavity 4 is 6 cm.

Four layers of the metal grid 5 are arranged at the connecting positions of the discharge cavities and the inner walls of the vacuum chamber. The metal grid is insulated from the inner wall of the vacuum chamber and is connected to a pulse power source 6. The discharge cavity 4 is provided with a discharge source 7 therein, and the discharge source is connected to a power source 8. The discharge cavity is connected with a carrier gas pipe 9. The other end of the carrier gas pipe is connected to a carrier gas source. A monomer vapor pipe 10 is connected to the vacuum chamber, and an outlet thereof is located in front of the discharge cavity 4, with the other end of the monomer vapor pipe being connected to a monomer vapor source.

The metal grid is made of a nickel material, the hole size of the metal grid is 600 meshes, and the pass-through rate is 32%.

The pulse power source 6 outputs a positive pulse with the following parameters: peak is 86 V, pulse width is 0.1 ms, and repeat frequency is 700 Hz.

The discharge source 7 is an electrode and has a discharge power of 280 W.

A tail gas collecting tube 11 is vertically provided along the central axis of the vacuum chamber. One end of the tail gas collecting tube extends from the vacuum chamber and is connected to a vacuum pump, and holes are provided on the wall of the tail gas collecting tube. The inner diameter of the tail gas collecting tube 11 is 60 mm. Holes are evenly provided on the wall of the tail gas collecting tube; the hole size is 16 mm, and the space between holes is 55 mm.

A rotation rack 12 is provided in the vacuum chamber. The rotation shaft of the rotation rack 12 is coaxial with the central axis of the vacuum chamber, and a substrate to be treated is placed on the rotation rack. Two planetary rotation shafts 13 are symmetrically provided on the rotation rack; the planetary rotation shafts are perpendicular to the rotation rack 12 and are able to rotate.

The planetary rotation shafts are provided with eight layers of rotation substrate platforms 14, and the substrates 15 to be treated are placed on the substrate platforms.

Representative Embodiment 3

A plasma polymerization coating device includes a vacuum chamber. Any cross section of a chamber body inner wall of the side part of a vacuum chamber 1 is in the shape of a normal nonagon with the same edge length.

The top cover and bottom cover of the vacuum chamber 1 each have an arched structure in the shape of a normal nonagon, which matches the cross section of the chamber body inner wall of the side part of the vacuum chamber.

Porous electrodes 2 are installed in the vacuum chamber 1 close to the inner wall of the vacuum chamber 1 and form a porous arched structure and is placed at a distance from the inner wall of the vacuum chamber. The porous electrodes 2 are connected with a radio frequency power source 3. Two discharge cavities 4 are provided on the outer wall of the vacuum chamber in a sealed manner.

The porous electrodes 2 have four sections of cylindrical shape and are coaxial with the vacuum chamber; their distance from the inner wall of the vacuum chamber is 6 cm. The porous electrodes 2 are covered by through holes, with the size of a through hole being 30 mm and the space between through holes being 30 mm. The power of the radio frequency power source connected with the porous electrodes is 1,000 W.

The discharge cavity 4 is in a cylindrical shape and is made from a stainless steel material; the diameter thereof is 12 cm and the depth thereof is 3 cm. The distance between two neighboring discharge cavities 4 is 7 cm. In addition, the distance between the outlet of the monomer vapor pipe 10 and the discharge cavity 4 is 10 cm.

Five layers of the metal grid 5 are arranged at the connecting positions of the discharge cavities and the inner walls of the vacuum chamber. The metal grid is insulated from the inner wall of the vacuum chamber and is connected to a pulse power source 6. The discharge cavity 4 is provided with a discharge source 7 therein, and the discharge source is connected to a power source 8. The discharge cavity is connected with a carrier gas pipe 9. The other end of the carrier gas pipe is connected to a carrier gas source. A monomer vapor pipe 10 is connected to the vacuum chamber, and an outlet thereof is located in front of the discharge cavity 4, with the other end of the monomer vapor pipe being connected to a monomer vapor source.

The metal grid is made of a nickel material, the hole size of the metal grid is 1,000 meshes, and the pass-through rate is 25%.

The pulse power source 6 outputs a positive pulse with the following parameters: peak is 140 V, pulse width is 2 μs, and repeat frequency is 20 Hz.

The discharge source 7 is a microwave antenna and has a discharge power of 500 W.

A tail gas collecting tube 11 is vertically provided along the central axis of the vacuum chamber. One end of the tail gas collecting tube extends from the vacuum chamber and is connected to a vacuum pump, and holes are provided on the wall of the tail gas collecting tube. The inner diameter of the tail gas collecting tube 11 is 100 mm. Holes are evenly provided on the wall of the tail gas collecting tube; the hole size is 30 mm, and the space between holes is 100 mm.

A rotation rack 12 is provided in the vacuum chamber. The rotation shaft of the rotation rack 12 is coaxial with the central axis of the vacuum chamber, and a substrate to be treated is placed on the rotation rack. Eight planetary rotation shafts 13 are symmetrically provided on the rotation rack; the planetary rotation shafts are perpendicular to the rotation rack 12 and are able to rotate.

The planetary rotation shafts are provided with two layers of rotation substrate platforms 14, and the substrates 15 to be treated are placed on the substrate platforms.

Representative Embodiment 4

A plasma polymerization coating device includes a vacuum chamber. Any cross section of a chamber body inner wall of the side part of a vacuum chamber 1 is in the shape of normal dodecagon with the same edge length.

The top cover and bottom cover of the vacuum chamber 1 each have an arched structure in the shape of a normal dodecagon, which matches the cross section of the chamber body inner wall of the side part of the vacuum chamber.

Porous electrodes 2 are installed in the vacuum chamber 1 close to the inner wall of the vacuum chamber 1. The porous electrodes 2 form a porous arched structure and is placed at a distance from the inner wall of the vacuum chamber; the porous electrodes 2 are connected with a radio frequency power source 3. Two discharge cavities 4 are provided on the outer wall of the vacuum chamber in a sealed manner.

The porous electrodes 2 have five sections of cylindrical shape, and the porous electrodes are coaxial with the vacuum chamber; their distance from the inner wall of the vacuum chamber is 5 cm. The porous electrodes 2 are covered by through holes, with the size of a through hole being 12 mm and the space between through holes being 18 mm. The power of the radio frequency power source connected with the porous electrodes is 260 W.

The discharge cavity 4 is in a cylindrical shape and is made from a stainless steel material; the diameter thereof is 16 cm and the depth thereof is 6 cm. The distance between two neighboring discharge cavities 4 is 26 cm. In addition, the distance between the outlet of the monomer vapor pipe 10 and the discharge cavity 4 is 4 cm.

Six layers of the metal grid 5 are arranged at the connecting positions of the discharge cavities and the inner walls of the vacuum chamber. The metal grid is insulated from the inner wall of the vacuum chamber and is connected to a pulse power source 6. The discharge cavity 4 is provided with a discharge source 7 therein, and the discharge source is connected to a power source 8. The discharge cavity is connected with a carrier gas pipe 9. The other end of the carrier gas pipe is connected to a carrier gas source. A monomer vapor pipe 10 is connected to the vacuum chamber, and an outlet thereof is located in front of the discharge cavity 4, with the other end of the monomer vapor pipe being connected to a monomer vapor source.

The metal grid is made of a nickel material, the hole size of the metal grid is 360 meshes, and the pass-through rate is 28%.

The pulse power source 6 outputs a positive pulse with the following parameters: peak is 115 V, pulse width is 160 μs, and repeat frequency is 380 Hz.

The discharge source 7 is a lamp filament and has a discharge power of 130 W.

A tail gas collecting tube 11 is vertically provided along the central axis of the vacuum chamber. One end of the tail gas collecting tube extends from the vacuum chamber and is connected to a vacuum pump, and holes are provided on the wall of the tail gas collecting tube. The inner diameter of the tail gas collecting tube 11 is 85 mm. Holes are evenly provided on the wall of the tail gas collecting tube; the hole size is 18 mm, and the space between holes is 38 mm.

The rotation shaft of the rotation rack is coaxial with the central axis of the vacuum chamber. The rotation rack is adapted to rotate about the rotation shaft thereof. Two layers of substrate platforms are symmetrically fixed on the rotation rack, and the material to be treated is placed on the substrate platforms.

Representative Embodiment 5

A plasma polymerization coating device includes a vacuum chamber. Any cross section of a chamber body inner wall of the side part of a vacuum chamber 1 is in a circular shape with the same diameter.

The top cover and bottom cover of the vacuum chamber 1 are each a circular flat plate, which matches the cross section of the chamber body inner wall of the side part of the vacuum chamber.

Porous electrodes 2 are installed in the vacuum chamber 1 close to the inner wall of the vacuum chamber 1. The porous electrodes 2 form a porous arched structure and is placed at a distance from the inner wall of the vacuum chamber and are connected with a radio frequency power source 3. Two discharge cavities 4 are provided on the outer wall of the vacuum chamber in a sealed manner.

The porous electrodes 2 have eight sections of cylindrical shape, and the porous electrodes are coaxial with the vacuum chamber. Their distance from the inner wall of the vacuum chamber is 2 cm. The porous electrodes 2 are covered by through holes, with the size of a through hole being 5 mm and the space between through holes being 12 mm. The power of the radio frequency power source connected with the porous electrodes is 120 W.

The discharge cavity 4 is in a cylindrical shape and is made from a carbon steel material; the diameter thereof is 11 cm and the depth thereof is 8 cm. The distance between two neighboring discharge cavities 4 is 20 cm. In addition, the distance between the outlet of the monomer vapor pipe 10 and the discharge cavity 4 is 7 cm.

Three layers of the metal grid 5 are arranged at the connecting positions of the discharge cavities and the inner walls of the vacuum chamber. The metal grid is insulated from the inner wall of the vacuum chamber and is connected to a pulse power source 6. The discharge cavity 4 is provided with a discharge source 7 therein, and the discharge source is connected to a power source 8. The discharge cavity is connected with a carrier gas pipe 9. The other end of the carrier gas pipe is connected to a carrier gas source. A monomer vapor pipe 10 is connected to the vacuum chamber, and an outlet thereof is located in front of the discharge cavity 4, with the other end of the monomer vapor pipe being connected to a monomer vapor source.

The metal grid is made of a nickel material, the hole size of the metal grid is 640 meshes, and the pass-through rate is 30%.

The pulse power source 6 outputs a positive pulse with the following parameters: peak is 58 V, pulse width is 620 µs, and repeat frequency is 55 Hz.

The discharge source 7 is an induction coil and has a discharge power of 480 W.

A tail gas collecting tube 11 is vertically provided along the central axis of the vacuum chamber. One end of the tail gas collecting tube extends from the vacuum chamber and is connected to a vacuum pump, and holes are provided on the wall of the tail gas collecting tube. The inner diameter of the tail gas collecting tube 11 is 45 mm. Holes are evenly provided on the wall of the tail gas collecting tube; the hole size is 24 mm, and the space between holes is 58 mm.

The rotation shaft of the rotation rack is coaxial with the central axis of the vacuum chamber. The rotation rack is adapted to rotate about the rotation shaft thereof. Eight layers of substrate platforms are symmetrically fixed on the rotation rack, and the material to be treated is placed on the substrate platforms.

The foregoing description of various embodiments of the claimed subject matter has been provided for the purposes of illustration and description. It is not intended to be exhaustive or to limit the claimed subject matter to the precise forms disclosed. Many modifications and variations will be apparent to one skilled in the art. Embodiments were chosen and described in order to best describe the principles of the invention and its practical applications, thereby enabling those skilled in the relevant art to understand the claimed subject matter, the various embodiments, and the various modifications that are suited to the particular uses contemplated.

Although the Detailed Description describes certain embodiments and the best mode contemplated, the technology can be practiced in many ways no matter how detailed the Detailed Description appears. Embodiments may vary considerably in their implementation details, while still being encompassed by the specification. Particular terminology used when describing certain features or aspects of various embodiments should not be taken to imply that the terminology is being redefined herein to be restricted to any specific characteristics, features, or aspects of the technology with which that terminology is associated. In general, the terms used in the following claims should not be construed to limit the technology to the specific embodiments disclosed in the specification, unless those terms are explicitly defined herein. Accordingly, the actual scope of the technology encompasses not only the disclosed embodiments, but also all equivalent ways of practicing or implementing the embodiments.

The language used in the specification has been principally selected for readability and instructional purposes. It may not have been selected to delineate or circumscribe the subject matter. It is therefore intended that the scope of the technology be limited not by this Detailed Description, but rather by any claims that issue on an application based hereon. Accordingly, the disclosure of various embodiments is intended to be illustrative, but not limiting, of the scope of the technology as set forth in the following claims.

What is claimed is:

1. A plasma polymerization apparatus comprising:
    a reaction chamber in a shape substantially symmetrical to a central axis;
    a rotation rack in the reaction chamber, the rotation rack configured to carry one or more substrates that are to receive plasma polymerization coating, the rotation rack operable to rotate relative to the reaction chamber about the central axis of the reaction chamber;
    a plurality of reactive species discharge mechanisms positioned evenly spaced around a perimeter of the reaction chamber and operable to disperse reactive species into the reaction chamber in a substantially symmetrical manner from the outer perimeter of the reaction chamber toward the central axis of the reaction chamber, such that the reactive species form a polymeric coating on surfaces of the one or more substrates during said dispersion of the reactive species; wherein each reactive species discharge mechanism includes:
    (1) a monomer source configured to receive a monomer; and
    (2) a discharge cavity operable to produce plasma to generate at least a portion of the reactive species based on the monomer, wherein the discharge cavity includes:
        (a) a carrier gas source configured to receive a carrier gas;
        (b) an electrical power discharge source operable to generate the plasma based on the carrier gas;
        (c) a metal grid positioned between the carrier gas source and the reaction chamber;
    an electrode placed in between the discharge cavities and the rotation rack, wherein the electrode is shared by the plurality of reactive species discharge mechanisms; and
    a collecting tube connected to a vacuum pump and positioned along the central axis of the reaction chamber and operable to have an air pressure lower than the reaction chamber to collect remaining reactive species at an exhaust rate,
    wherein the carrier gas source, the electrical power discharge source, and the vacuum pump are collectively adjusted to achieve an equilibrium where a density decrease in the reactive species due to consumption of the reactive species substantially equals a density increase in the reactive species due to the reactive species converging toward the collecting tube, thereby resulting in a substantially uniform density of the reactive species across the reaction chamber.

2. The apparatus of claim 1, wherein the rotation rack includes two sides substantially symmetrical to the central axis of the reaction chamber, each side having a set of substrate platforms for carrying substrates, each set of substrate platforms being operable to rotate about a planetary rotation axis that is adjacent to the central axis of the reaction chamber.

3. The apparatus of claim 2, wherein the apparatus is configured such that, during said dispersion of the reactive species, each set of substrate platforms rotates about a corresponding planetary rotation axis meanwhile revolving around the central axis of the reaction chamber.

4. The apparatus of claim 2, wherein the planetary rotation axis of each set of substrate platforms and the central axis of the reaction chamber are substantially parallel.

5. The apparatus of claim 1,
wherein the metal grid is operable to at least partially control a dispersion rate of the plasma into the reaction chamber.

6. The apparatus of claim 5, wherein the discharge cavity further includes:
a pulse power source coupled to the metal grid and operable to alter, via an electrical pulse, a voltage bias of the metal grid, such that the plasma generated in the discharge cavity is dispersed into the reaction chamber in response to the electrical pulse.

7. The apparatus of claim 1, wherein the electrode is porous and coupled to a radio frequency power source.

8. The apparatus of claim 7, wherein the continuous plasma is generated from the monomer.

9. The apparatus of claim 1, wherein the reactive species discharge mechanism includes:
a radio frequency power source coupled to the electrode, wherein the electrode is operable to generate a continuous plasma to pretreat the surfaces of the one or more substrates before said dispersion of the reactive species and/or to generate at least a portion of the reactive species based on the monomer.

10. A plasma polymerization coating device comprising:
a vacuum chamber, characterized in that a top view cross section of a chamber body inner wall along a perimeter of the vacuum chamber is: a circle with the same diameter as other top view cross sections, or a polygon with the same edge length as other top view cross sections, wherein the polygon has at least 6 edges;
one or more porous electrodes installed in the vacuum chamber proximal to the inner wall of the vacuum chamber, the porous electrodes forming a porous arched structure with a distance from the inner wall of the vacuum chamber, the porous electrodes connected with a radio frequency power source;
at least two discharge cavities provided on an outer wall of the vacuum chamber in a sealed manner, each discharge cavity having a discharge source provided therein, the discharge source connected to a power source, each discharge cavity connected with one end of a carrier gas pipe, the other end of the carrier gas pipe configured for connection to a carrier gas source, wherein the at least two discharge cavities share a porous electrode;
at least two layers of metal grid arranged at where the discharge cavities connect to the inner walls of the vacuum chamber, each discharge cavity having an individual metal grid, the metal grid being electrically insulated from the inner wall of the vacuum chamber, the metal grid connected to a pulse power source;
a monomer vapor pipe connected to the vacuum chamber, an outlet end of the monomer vapor pipe located adjacent to the discharge cavity, the other end of the monomer vapor pipe configured for connection to a monomer vapor source;
a tail gas collecting tube vertically provided along a central axis of the vacuum chamber, one end of the tail gas collecting tube extending out from the vacuum chamber and connected to a vacuum pump, wherein holes are provided on walls of the tail gas collecting tube;
and a rotation rack, for carrying a substrate to be treated, provided in the vacuum chamber, the rotation rack can rotate about an axis that is coaxial with the central axis of the vacuum chamber,
wherein the carrier gas source, the pulse power source, and the vacuum pump are collectively adjusted to achieve an equilibrium where a density decrease in a reactive species due to consumption of the reactive species substantially equals a density increase in the reactive species due to the reactive species converging toward the tail gas collecting tube, thereby resulting in a substantially uniform density of the reactive species across the vacuum chamber.

11. The plasma polymerization coating device according to claim 10, characterized in that a top cover and a bottom cover of the vacuum chamber are in a flat or arched structure matching the top view cross section of the chamber body inner wall of the vacuum chamber.

12. The plasma polymerization coating device according to claim 10, characterized in that the porous electrodes are in at least partially a cylindrical shape and are coaxial with the vacuum chamber, that the distance from the inner wall of the vacuum chamber ranges from 1 to 6 cm, that the porous electrodes are covered by through holes, that the size of a through hole ranges from 2 to 30 mm, that the space between through holes ranges from 2 to 30 mm, and that the power of the radio frequency power source connected to the porous electrodes ranges from 15 to 1,000 W.

13. The plasma polymerization coating device according to claim 10, characterized in that the discharge cavity is in a cylindrical shape and is made from a material of aluminum, carbon steel or stainless steel, that the diameter of the discharge cavity ranges from 5 to 20 cm, that the depth of the discharge cavity is from 3 to 15 cm, that the distance between two neighboring discharge cavities ranges from 7 to 40 cm, and that the distance between the outlet end of the monomer vapor pipe and the discharge cavity ranges from 1 to 10 cm.

14. The plasma polymerization coating device according to claim 10, characterized in that the number of layers of the metal grid ranges from 2 to 6, that the metal grid is made of a stainless steel or nickel material, that the number of openings of the metal grid rangers from 100 to 1,000 meshes, an that a pass-through rate of the metal grid ranges from 25% to 40%.

15. The plasma polymerization coating device according to claim 10, characterized in that the pulse power source outputs a positive pulse with the following parameters: pulse peak ranging from 20 to 140 V, pulse width ranging from 2 μs to 1 ms, and repeat frequency ranging from 20 Hz to 10 kHz.

16. The plasma polymerization coating device according to claim 10, characterized in that the discharge source is a lamp filament, an electrode, an induction coil, or a microwave antenna, and has the discharge power ranging from 2 to 500 W.

17. The plasma polymerization coating device according to claim 10, characterized in that an inner diameter of the tail gas collecting tube ranges from 25 to 100 mm, that the holes of the tail gas collecting tube are evenly provided on the wall of the tail gas collecting tube, that the hole size ranges from 2 to 30 mm, and that the space between the holes of the tail gas collecting tube ranges from 2 to 100 mm.

18. The plasma polymerization coating device according to claim 10, characterized in that 2 to 8 substrate platforms are symmetrically affixed to the rotation rack, and that the substrate platforms are configured for placing material to be treated.

19. The plasma polymerization coating device according to claim 10, characterized in that 2 to 8 planetary rotation shafts are symmetrically provided on the rotation rack, that the planetary rotation shafts are perpendicular to the rotation rack and are able to rotate, wherein the planetary rotation shafts are provided with 2 to 8 layers of rotation substrate platforms, and wherein the substrate platforms are configured for placing material to be treated.

* * * * *